United States Patent
Um

(10) Patent No.: US 10,490,293 B2
(45) Date of Patent: Nov. 26, 2019

(54) NON-VOLATILE MEMORY DEVICE, METHOD FOR OPERATING THE SAME AND DATA STORAGE DEVICE INCLUDING THE SAME

(71) Applicant: SK hynix Inc., Gyeonggi-do (KR)

(72) Inventor: Gi Pyo Um, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 11 days.

(21) Appl. No.: 15/980,313

(22) Filed: May 15, 2018

(65) Prior Publication Data
US 2019/0103165 A1    Apr. 4, 2019

(30) Foreign Application Priority Data
Sep. 29, 2017    (KR) .................. 10-2017-0127218

(51) Int. Cl.
*G11C 16/04* (2006.01)
*G11C 16/34* (2006.01)
*G11C 11/56* (2006.01)
*G11C 16/10* (2006.01)

(52) U.S. Cl.
CPC ...... *G11C 16/3463* (2013.01); *G11C 11/5628* (2013.01); *G11C 16/10* (2013.01); *G11C 16/3413* (2013.01); *G11C 11/5671* (2013.01); *G11C 16/0483* (2013.01); *G11C 2211/5646* (2013.01)

(58) Field of Classification Search
CPC .................. G11C 16/3463; G11C 16/0483
USPC ....................... 365/185.03, 185.18
See application file for complete search history.

(56) References Cited

U.S. PATENT DOCUMENTS

2009/0147574 A1* 6/2009 Jeong ............... G11C 11/5621
                                                           365/185.03
2012/0224430 A1* 9/2012 Visconti ............... G11C 16/10
                                                           365/185.19

FOREIGN PATENT DOCUMENTS

KR     1020130134186     12/2013

* cited by examiner

*Primary Examiner* — Vu A Le
(74) *Attorney, Agent, or Firm* — IP & T Group LLP

(57) ABSTRACT

A non-volatile memory device may include a memory cell array, a peripheral circuit and a control logic. The memory cell array may include pages including data cells and over-program flag cells configured to represent whether or not the data cells may correspond to an over-programmed cells. The peripheral circuit may be configured to store data in the memory cell array or read the data from the memory cell array. The control logic may be configured to determine whether or not the data cells are programmable when a program command may be received from an external device. The control logic may be configured to program the over-program flag cell corresponding to the data cells when the data cells are not programmable.

19 Claims, 9 Drawing Sheets

NON-VOLATILE MEMORY DEVICE, METHOD FOR OPERATING THE SAME AND DATA STORAGE DEVICE INCLUDING THE SAME

CROSS-REFERENCES TO RELATED APPLICATION

The present application claims priority under 35 U.S.C. § 119(a) to Korean patent application number 10-2017-0127218, filed on Sep. 29, 2017, which is herein incorporated by reference in its entirety.

BACKGROUND

1. Technical Field

Various embodiments generally relate to a semiconductor device, more particularly a non-volatile memory device, a method for operating the non-volatile memory device, and a data storage device including the non-volatile memory device.

2. Related Art

Recently, paradigm of computer environments may be converted into a ubiquitous computing system used anytime anywhere. Thus, a portable electronic device such as a cellular phone, a digital camera, a notebook computer, etc., may be widely used. The portable electronic device may include a data storage device using a memory device. The data storage device may be used for storing data of the portable electronic device.

The data storage device using the memory device may not include a mechanical driving mechanism. Thus, the data storage device may have good stability and reliability. Further, the data storage device may have rapid access speed and low power consumption. The data storage device may include a universal serial bus (USB) memory card, a memory card including various interfaces, a universal flash storage (UFS) card, a solid state drive (SSD), etc.

SUMMARY

Example embodiments may provide a non-volatile memory device capable of readily detecting an invalid page.

Example embodiments may also provide a method for operating the above-mentioned non-volatile memory device.

Example embodiments may still also provide a data storage device including the non-volatile memory device.

In an embodiment, a non-volatile memory device may include a memory cell array, a peripheral circuit and a control logic. The memory cell array may include pages including data cells and over-program flag cells configured to represent whether or not the data cells may correspond to an over-programmed cells. The peripheral circuit may be configured to store data in the memory cell array or read the data from the memory cell array. The control logic may be configured to determine whether or not the data cell may be programmable when a program command may be received from an external device. The control logic may be configured to program the over-program flag cell corresponding to the data cells when the data cell are not programmable.

In an embodiment, in a method for operating a non-volatile memory device, whether or not a program command may be received from an external device may be determined. Whether or not data cells may be programmable may be determined when the program command may be received. An over-program flag cell corresponding to the data cells may be programmed when the data cell may not be programmable.

In an embodiment, a data storage device may include a non-volatile memory device and a controller. The non-volatile memory device may include a memory cell array, a peripheral circuit and a control logic. The memory cell array may include pages including data cells and over-program flag cells configured to represent whether or not the data cells may correspond to an over-programmed cells. The peripheral circuit may be configured to store data in the memory cell array or read the data from the memory cell array. The control logic may be configured to determine whether or not the data cells may be programmable when a program command may be received from the controller. The control logic may be configured to program the over-program flag cell corresponding to the data cells when the data cell may not be programmable.

In an embodiment, a non-volatile memory device may include a plurality of memory cells; and a control unit configured to label data of programmed memory cells as invalid while programming the programmed memory cells in response to a program command for the programmed memory cells, and provide data validity information of the programmed memory cells.

DETAILED DESCRIPTION

Figure 1:
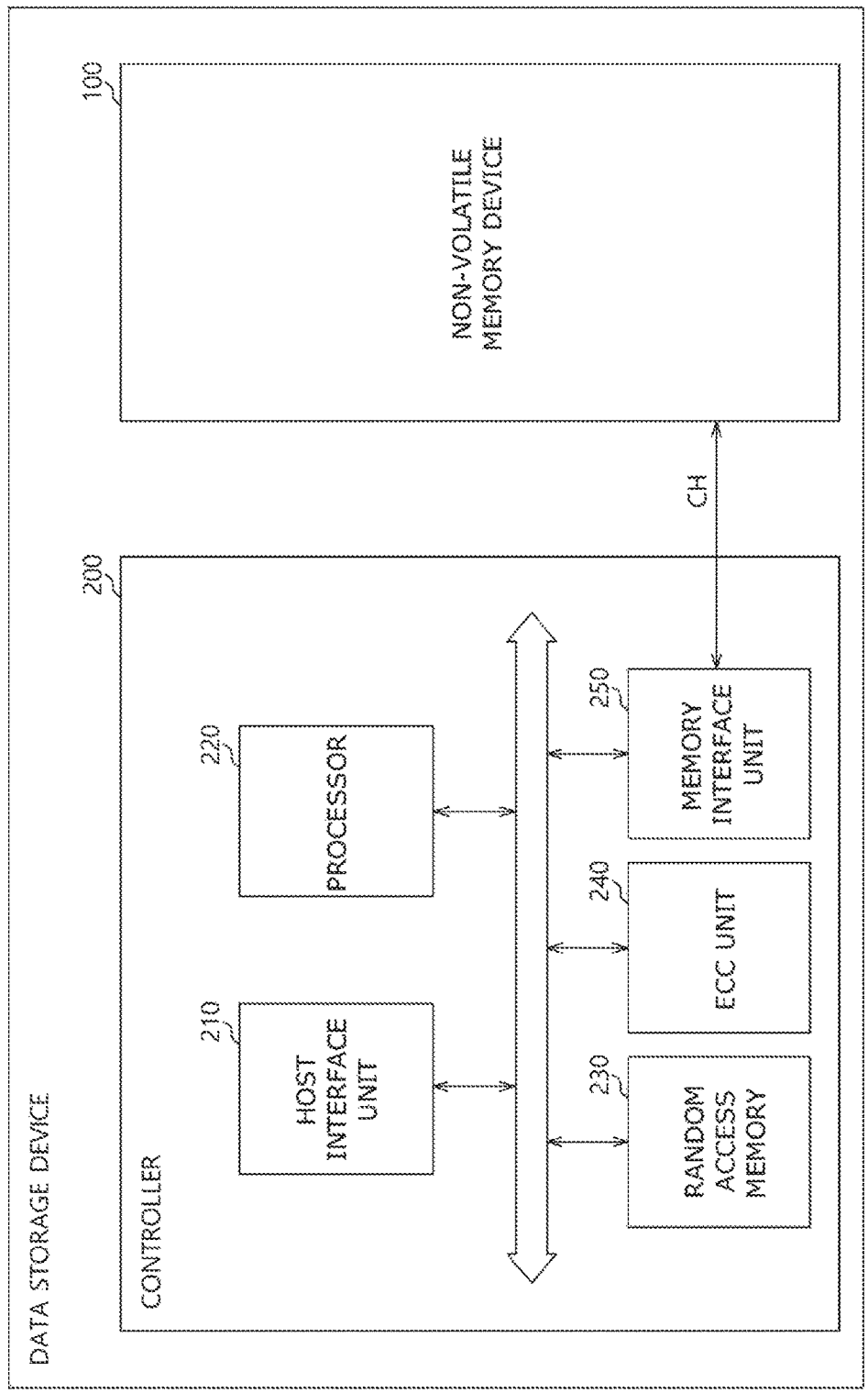
FIG. 1 is a block diagram illustrating a data storage device in accordance with example embodiments.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

The phrase "at least one of . . . and . . . ," when used herein with a list of items, means a single item from the list or any combination of items in the list. For example, "at least one of A, B, and C" means, only A, or only B, or only C, or any combination of A, B, and C.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It is also noted, that in some instances, as would be apparent to those skilled in the relevant art, an element also referred to as a feature described in connection with one embodiment may be used singly or in combination with other elements of another embodiment, unless specifically indicated otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

Hereinafter, example embodiments will be described below with reference to the accompanying drawings through various examples of embodiments.

FIG. 1 is a block diagram illustrating a data storage device in accordance with example embodiments.

Referring to FIG. 1, a data storage device 10 of this example embodiment may store data accessed by a host device such as a cellular phone, an MP3 player, a laptop computer, a desktop computer, a game machine, a TV, an in-vehicle infotainment system, etc. The data storage device 10 may be referred to as a memory system.

The data storage device 10 may include various storage devices in accordance with an interface protocol connected with the host device. For example, the data storage device 10 may include any one of a solid state drive (SSD), a multimedia card such as an MMC, an eMMC, an RS-MMC, a micro-MMC, etc., a secure digital card such as an SD, a mini-SD, a micro-SD, etc., a storage device such as a universal storage bus (USB), a universal flash storage (UFS), a personal computer memory card international association (PCMCIA), etc., a peripheral component interconnection card, a PCI-express (PCI-E) card, a compact flash (CF) card, a smart media card, a memory stack, etc.

The data storage device 10 may have any one of various package structures. For example, the data storage device 10 may have a package-on-package (POP), a system-in-package (SIP), a system-on-chip (SOC), a multi-chip package (MCP), a chip-on-board (COB), a wafer-level fabricated package (WFP), a wafer-level stack package (WSP), etc.

The data storage device 10 may include a non-volatile memory device 100 and a controller 200.

The non-volatile memory device 100 may be operated as a storage medium of the data storage device 10. The non-volatile memory device 100 may include a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using chalcogenide compounds, a resistive random access memory (RERAM) using a transition metal oxide compound, etc.

In FIG. 1, the data storage device 10 may include the single non-volatile memory device 100. Alternatively, the data storage device 10 may include a plurality of the non-volatile memory devices 100. Example embodiments may be applied to the data storage device 10 including the plurality of the non-volatile memory devices 100.

Figure 2:
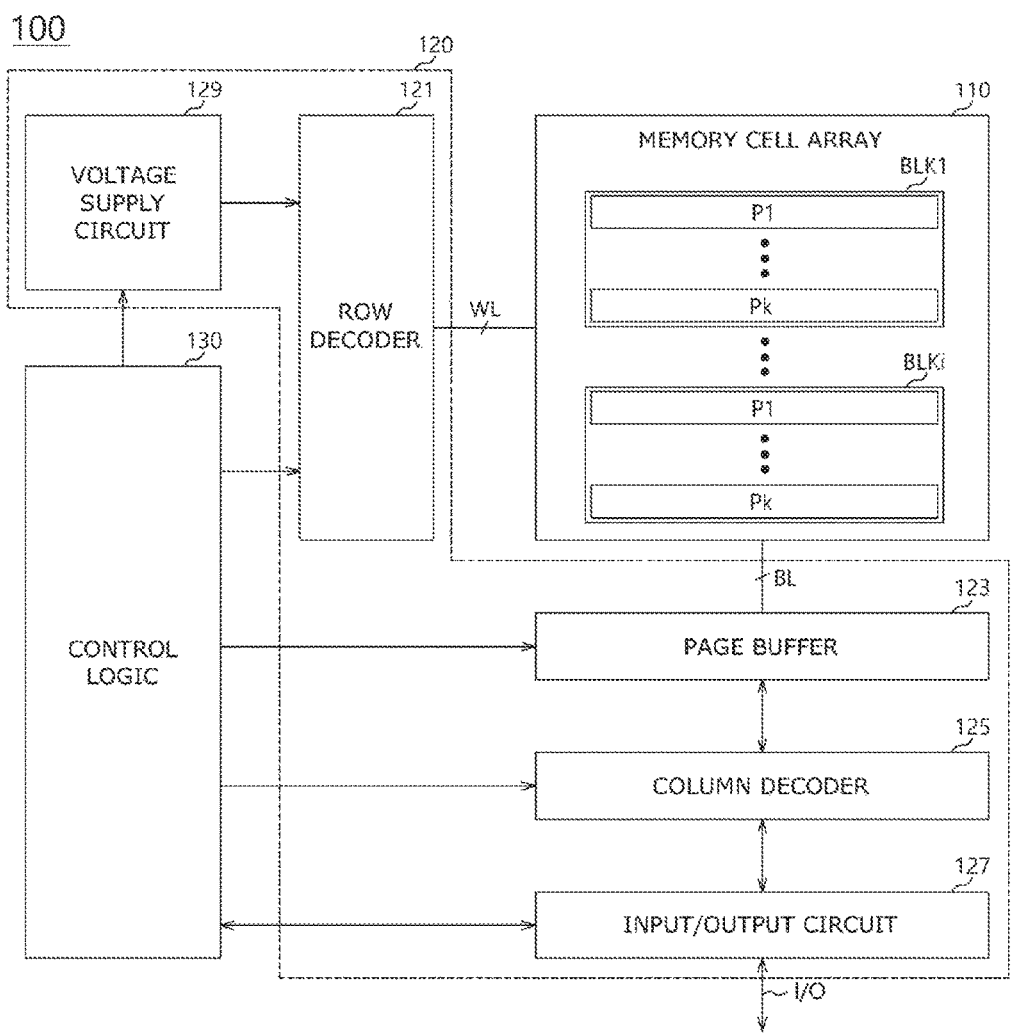
FIG. 2 is a block diagram illustrating a non-volatile memory device in FIG. 1.

FIG. 2 is a block diagram illustrating a non-volatile memory device in FIG. 1.

Referring to FIG. 2, the non-volatile memory device 100 may include a memory cell array 110, a peripheral circuit 120 and a control logic 130.

The memory cell array 110 may include memory cells arranged at intersected regions between word line WLn and bit lines BLm. For example, each of the memory cells may include a single level cell (SLC) configured to store one bit, a multi level cell (MLC) configured to store two bits, a triple level cell (TLC) configured to store three bits, a quad level cell (QLC) configured to store four bits, etc. The memory cell array 110 may include at least one of the SLC, the MLC, the TLC and the QLC. For example, the memory cell array 110 may include the memory cells having a two-dimensional structure or a three-dimensional structure.

The peripheral circuit 120 may include functional blocks configured to store data received from an external device in the memory cell array 110 or to read and output data from the memory cell array 110. For example, the peripheral circuit 120 may include a row decoder 121, a page buffer 123, a column decoder 125, an input/output circuit 127 and a voltage supply circuit 129.

The row decoder 121 may select any one of the word lines WL connected with the memory cell array 110. For example, the row decoder 121 may select any one of the word lines WL based on a row address received from the control logic 130. The row decoder 121 may provide the selected word line with a word line voltage provided from the voltage supply circuit 129.

The page buffer 123 may be connected with the memory cell array 110 through the bit lines BL. The page buffer 123 may temporarily store program data written in the memory cell array 110 or read data read from the memory cell array 110.

The column decoder 125 may select any one of the bit lines BL connected with the memory cell array 110. For example, the column decoder 125 may select any one of the bit lines BL based on a column address received from the control logic 130.

The input/output circuit 127 may be connected with the controller 200 through input/output lines I/O. The input/output circuit 127 may transmit/receive commands, addresses and data to/from the controller 200.

The voltage supply circuit 129 may generate voltages used for operating the non-volatile memory device 100. The voltages generated by the voltage supply circuit 129 may be applied to the memory cells of the memory cell array 110. For example, a programming voltage generated in a programming operation may be applied to the word line of the memory cells on which the programming operation may be performed. Alternatively, an erasing voltage generated in an erasing operation may be applied to a well region of the memory cells on which the erasing operation may be performed. Alternatively, a reading voltage generated in a reading operation may be applied to the word line of the memory cells on which the reading operation may be performed.

The control logic 130 may control operations related to the programming operation, the reading operation and the erasing operation of the non-volatile memory device 100. For example, the control logic 130 may control the operations of the functional blocks of the peripheral circuit 120 to perform the programming operation and the reading operation in the memory cell array 110 in response to a programming command and a reading command received from the controller 200. The control logic 130 may control the operations of the functional blocks in the peripheral circuit 120 to perform the erasing operation in the memory cell array 110 in response to an erasing command received from the controller 200. The programming operation and the reading operation may be performed by a page unit. The erasing operation may be performed by a block unit. However, the programming operation, the reading operation and the erasing operation may be performed in other manners as well as the above-mentioned manner.

Figure 3:
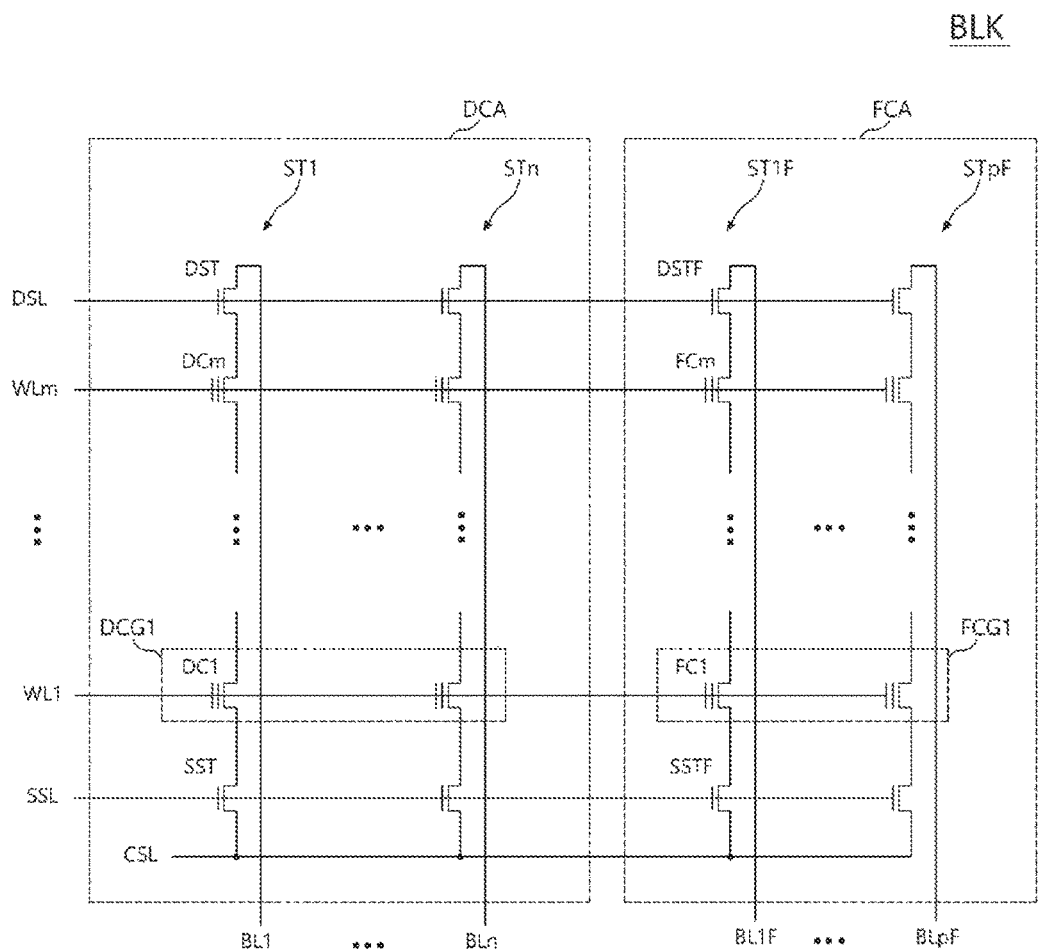
FIG. 3 is a circuit diagram illustrating a memory block of a memory cell array in FIG. 1.

FIG. 3 is a circuit diagram illustrating a memory block of a memory cell array in FIG. 1. In FIG. 2, the memory cell array 110 may include memory blocks BLK1 to BLKi. Each of the memory blocks BLK1 to BLKi may have a structure in FIG. 3. However, the structure of each of the memory blocks BLK1 to BLKi may not be restricted to the structure illustrated in FIG. 3.

Referring to FIG. 3, the memory block BLK may include a data cell region DCA and a flag cell region FCA. The data cell region DCA and the flag cell region FCA may be logically separated from each other.

The data cell region DCA may store data provided from the controller 200. Although not depicted in FIG. 3, the data cell region DCA may include a main region and a spare region. The main region may store data on which a program operation may be performed from a host device. The spare region may store information related to the data in the main region such as meta-data including an error correction code.

The data cell region DCA may include a plurality of cell strings ST1 to STn connected with the bit lines BL1 to BLn. The cell strings ST1 to STn may have substantially the same configuration. Hereinafter, one cell string ST1 among the cell strings ST1 to STn may be illustrated.

The cell string ST1 may include a plurality of data cells DC1 to DCm and selection transistors DST and SST. The data cells DC1 to DCm may be connected between the bit line BL1 and a common source line CSL. Particularly, the cell string ST1 may include the drain selection transistor DST connected with a drain selection line DSL, the data cells DC1 to DCm connected with the word lines WL1 to WLm, and the source selection transistor SST connected with a source selection line SSL.

The flag cell region FCA may include a plurality of flag cell strings ST1F to STpF connected with a plurality of flag bit lines BLiF to BLpF. The flag cell strings ST1F to STpF may have substantially the same configuration. Hereinafter, one flag cell string ST1F among the flag cell strings ST1F to STpF may be illustrated.

The flag cell string ST1F may include a plurality of flag cells FC1 to FCm and selection transistors DSTF and SSTF. The flag cells FC1 to FCm may be connected between the bit line BL1 and the common source line CSL. Particularly, the flag cell string ST1F may include the drain selection transistor DSTF connected with the drain selection line DSL, the flag cells FC1 to FCm connected with the word lines WL1 to WLm, and the source selection transistor SSTF connected with the source selection line SSL.

Figure 4:
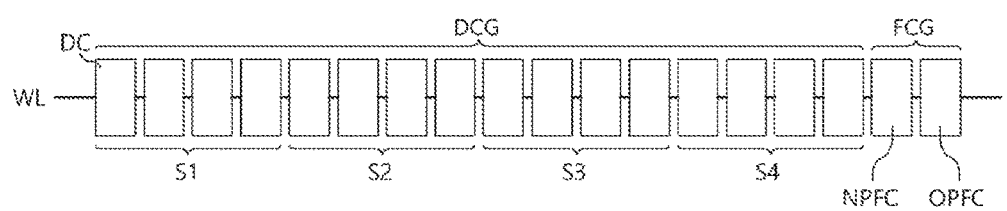
FIG. 4 is a block diagram illustrating a word line having a data cell region and a flag cell region.

FIG. 4 is a block diagram illustrating a word line having a data cell region and a flag cell region.

Referring to FIG. 4, a data cell group DCG may include a plurality of data cells DC. The data cells DC may be grouped into a plurality of sectors. In FIG. 4, four sectors S1 to S4 may be grouped. However, the number of the sectors may not be restricted to a specific number. Each of the sectors S1 to S4 may include at least one data cell DC. A programming operation with respect to the data cell group DCG may be simultaneously performed on the sectors S1 to S4 or individually performed on each of the sectors S1 to S4.

A flag cell group FCG may include a normal program flag cell NPFC and an over-program flag cell OPFC. In FIG. 4, the flag cell group FCG may include the normal program flag cell NPFC and the over-program flag cell OPFC. Alternatively, the flag cell group FCG may further include various flag cells configured to store various information with respect to data in the data cell group DCG.

The normal program flag cell NPFC may store information representing whether or not the data cells DC of the data cell group DCG are normally programmed data cells. The over-program flag cell OPFC may store information representing whether or not the data cells DC of the data cell group DCG are over-programmed data cells.

The normally programmed data cells are programmed cells when they are in an erased state. That is, the normally programmed cells are normally programmed ones when they are in a programmable state. The over-programmed data cells are duplicate programmed data cells when they are in a programmed state. That is, the over-programmed date cells are abnormally programmed ones when they are in a non-programmable state.

In example embodiments, a programming operation with respect to the normal program flag cell NPFC may be performed in response to an additional program command received from the controller 200. A programming operation with respect to the over-program flag cell OPFC may be performed by controls of the control logic 130 in the non-volatile memory device 100.

When the program request may be received from the host device, the controller 200 may generate the program command corresponding to the program request. The controller 200 may transmit the program command to the non-volatile memory device 100. The non-volatile memory device 100 may perform the program operations to the memory cell array 110 in response to the program command.

The program commands received from the controller 200 may include a single program command for programming the data cells DC of the data cell group DCG, and a complex program command for simultaneously programming the data cells DC of the data cell group DCG and the normal program flag cell NPFC of the flag cell group FCG corresponding to the data cell group DCG.

When the single program command is received from the controller 200, the control logic 130 of the non-volatile memory device 100 may the operations of the peripheral circuit 120 to program target data cells DC of a target data cell group DCG. Also, the complex program command is received from the controller 200, the control logic 130 may the operations of the peripheral circuit 120 to simultaneously program target data cells DC of a target data cell group DCG and the normal program flag cell NPFC of the flag cell group FCG corresponding to the target data cell group DCG.

When the single program command or the complex program command are received from the controller 200, the control logic 130 may determine whether or not the normal program flag cell NPFC of a target word line of the program command is already programmed. When the normal program flag cell NPFC of the target word line is already programmed, the control logic 130 may control the operations of the peripheral circuit 120 to simultaneously program the data cells DC of the target word line and the over-program flag cell OPFC of the target word line.

When the control logic 130 may receive a command for requesting state identifications of a word line from the controller 200, the control logic 130 may identify the normal program flag cell NPFC and the over-program flag cell OPFC in the flag cell group FCG of a target word line of the command. The control logic 130 may transmit to the controller 200 information whether the target word line is normally programmed or over-programmed.

For example, when the normal program flag cell NPFC of the target word line is programmed and the over-program flag cell OPFC is erased, the control logic 130 may transmit to the controller 200 state information in which the data cells DC of the target word line are the normally programmed data cells DC. This may mean that the data in the target word line are valid.

In contrast, when the normal program flag cell NPFC and the over-program flag cell OPFC of the target word line are programmed, the control logic 130 may transmit to the controller 200 state information in which the data cells DC of the target word line are the over-programmed data cells DC. This may mean that the data in the target word line are invalid.

The controller 200 may determine whether or not the programmed data in the target word line may be valid based on the state information of the target word line received from the control logic 130. That is, the controller 200 may readily determine whether or not the target word line is the over-programmed word line based on the state information provided from the non-volatile memory device 100 without performing an ECC decoding to the data in the target word line.

Further, when the programmed data in the target word line are determined to be invalid, the controller 200 may control an ECC unit 240 so that the ECC unit 240 does not perform the ECC decoding to the programmed data in the target word line. Because the unnecessary ECC decoding operation to the invalid data may not be performed, the data storage device 10 may have improved performance.

The controller 200 may control the operations of the data storage device 10 by driving a firmware or a software loaded in a random access memory. The controller 200 may decode and drive code type instructions or algorithms such as the firmware or the software. The controller 200 may include a hardware or a combination of a hardware and a software.

The controller 200 may include a host interface unit 210, a processor 220, a random access memory 230, an error correction code (ECC) unit 240 and a memory interface unit 250.

The host interface unit 210 may interface the host device with the data storage device 10 corresponding to the protocols of the host device. For example, the host interface unit 210 may be communicated with the host device through any one of a USB, a UFS, an MMC, a parallel advanced technology attachment (PATA), a serial advanced technology attachment (SATA), a small computer system interface (SCSI), a serial attached SISI (SAS), a peripheral component interconnection (PCI) and a PCI-E.

The processor 220 may include a micro control unit (MCU) and a central processing unit (CPU). The processor 220 may process requests transmitted from the host device. In order to process the request transmitted from the host device, the processor 220 may drive the instructions or the algorithms, i.e., the firmware in the random access memory 240. The processor 220 may control functional blocks such as the interface unit 210, the ECC unit 230, the random access memory 240 and the memory interface unit 250, and the non-volatile memory device 100.

The processor 220 may generate control signals for controlling the operations of the non-volatile memory device 100 based on the requests transmitted from the host device. The processor 220 may provide the memory interface unit 250 with the generated control signals. For example, the processor 220 may generate the single program command or the complex program command based on the program request transmitted from the host device. The processor 220 may provide the memory interface unit 250 with the single program command or the complex program command.

The processor 220 may generate the command for identifying the states of the target word line. The processor 220 may provide the memory interface unit 250 with the generated command.

The ECC unit 240 may correct errors in the data read from the non-volatile memory device 100. The ECC unit 240 may decode the read data by the error correction code to correct the errors in the data. For example, the error correction code may include Bose Chaudhri Hocquenghen (BCH) code, Reed Solomon code, Reed Muller (RM) code, Hamming code, convolution code, Low Density Parity Check (LDDC) code, etc.

The random access memory 230 may include a DRAM or an SRAM. The random access memory 230 may store the firmware driven by the processor 220. The random access memory 230 may store the data, for example, meta-data for driving the firmware. That is, the random access memory 230 may be operated as a working memory of the processor 220.

The random access memory 230 may temporarily store data transmitted from the host device to the non-volatile memory device 100 or data transmitted from the non-volatile memory device 100 to the host device. That is, the random access memory 230 may be operated as a buffer memory.

The memory interface unit 250 may control the non-volatile memory device 100 in accordance with the controls of the processor 220. The memory interface unit 250 may be referred to as a memory control unit. The memory interface unit 250 may provide the non-volatile memory device 100 with the control signals. The control signals may include commands, addresses, control signals, etc., for controlling the non-volatile memory device 100. The memory control unit 250 may provide the non-volatile memory device 100 with the data. The memory control unit 250 may receive the data from the non-volatile memory device 100.

Figure 5:
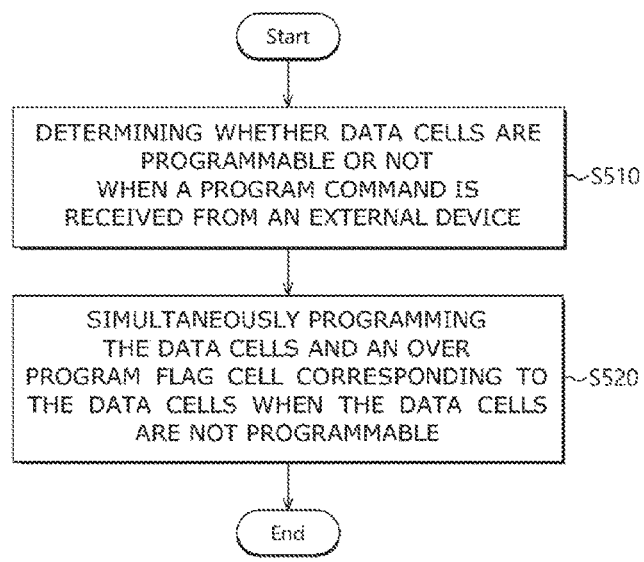
FIG. 5 is a flow chart illustrating operations for programming a word line in a method for operating a non-volatile memory device in accordance with example embodiments.

FIG. 5 is a flow chart illustrating operations for programming a word line in a method for operating a non-volatile memory device in accordance with example embodiments.

Referring to FIG. 5, in step S510, when the program command is received from the external device, the control logic 130 of the non-volatile memory device 100 may determine whether or not the data cells DC of a target word line WL to be programmed are programmable. The external device may include the controller 200. A method for determining whether or not the data cells DC of the target word line WL are programmable by the control logic 130 may be illustrated with reference to FIG. 6.

In step S520, when the data cells DC are not programmable, the control logic 130 may control the peripheral circuit 120 so that the data cells DC and the over-program flag cell OPFC corresponding to the data cells DC are simultaneously programmed.

Figure 6:
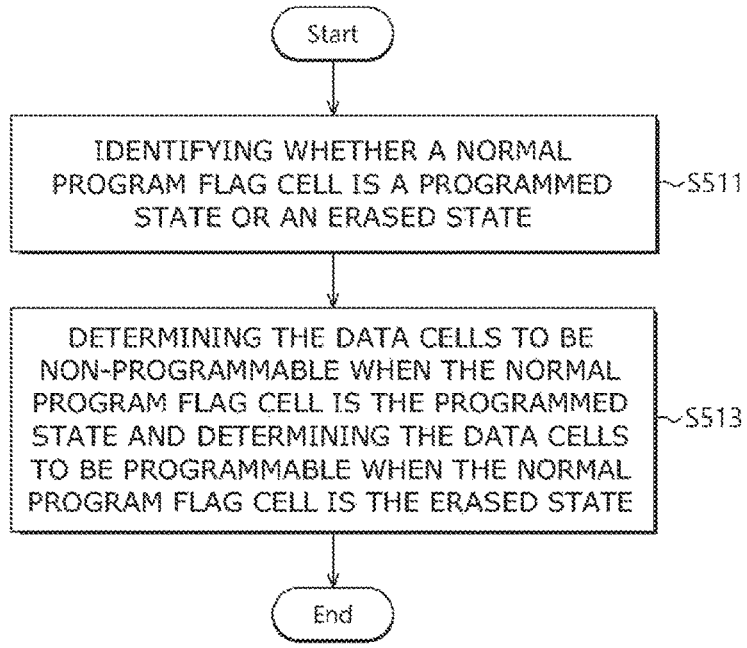
FIG. 6 is a flow chart illustrating step S510 in FIG. 5.

FIG. 6 is a flow chart illustrating step S510 in FIG. 5.

Referring to FIG. 6, in step S610, the control logic 130 may identify whether the normal program flag cell NPFC of the target word line is in the programmed state or the erased state.

In step S620, when the normal program flag cell NPFC of the target word line is in the programmed state, the control logic 130 may determine the target word line to be in non-programmable state. In contrast, when the normal program flag cell NPFC of the target word line is in the erased state, the control logic may determine the target word line to be in programmable state.

Figure 7:
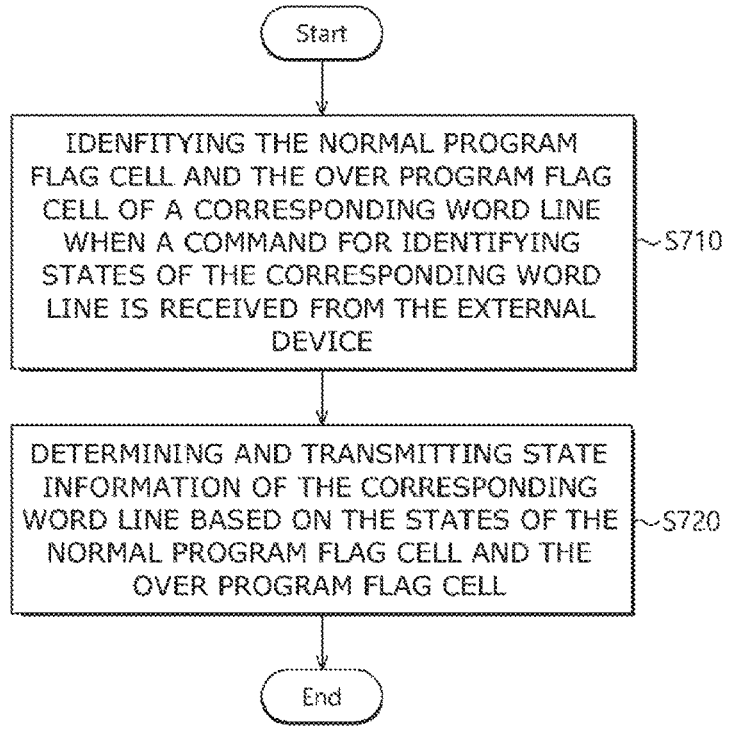
FIG. 7 is a flow chart illustrating operations for identifying and transmitting information of a word line in a method for operating a non-volatile memory device.

FIG. 7 is a flow chart illustrating operations for identifying and transmitting information of a word line in a method for operating a non-volatile memory device.

Referring to FIG. 7, in step S710, when the command for identifying the state of the target word line may be received from the external device, the control logic 130 may identify the normal program flag cell NPFC and the over-program flag cell OPFC of the target word line. For example, the control logic 130 may control the peripheral circuit 120 to read the normal program flag cell NPFC and the over-program flag cell OPFC and to identify whether the normal program flag cell NPFC and the over-program flag cell OPFC are the programmed state or the erased state.

In step S720, the control logic 130 may determine the state of the target word line based on the states of the normal program flag cell NPFC and the over-program flag cell OPFC. The control logic 130 may transmit the state information to the controller 200. For example, when the normal program flag cell NPFC is in the programmed state and the over-program flag cell OPFC is in the erased state, the control logic 103 may transmit the state information in which the data in the target word line is valid to the controller 200. In contrast, when the normal program flag cell NPFC and the over-program flag cell OPFC are in the programmed state, the control logic 103 may transmit the state information in which the data in the target word line are invalid to the controller 200.

Figure 8:
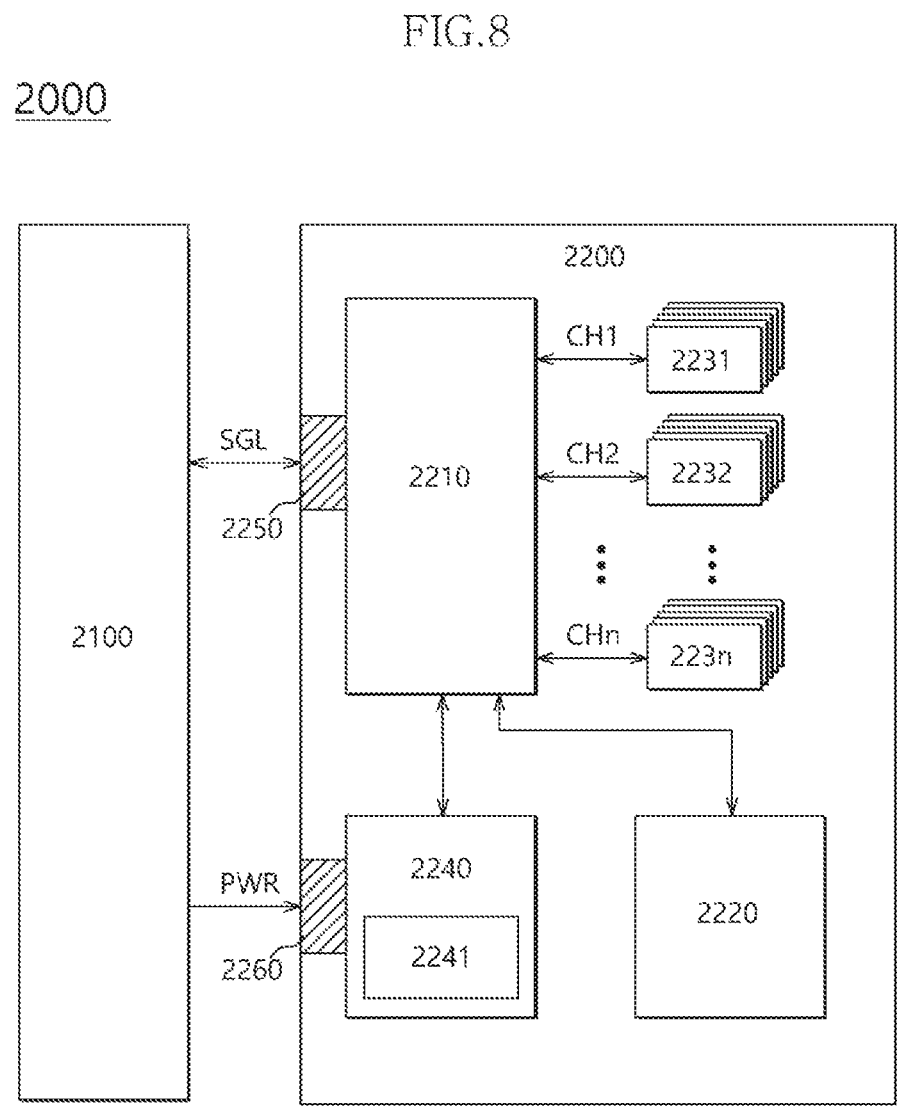
FIG. 8 is a diagram illustrating an example of a data processing system including a solid state drive (SSD) according to an embodiment of the present disclosure.

FIG. 8 is a diagram illustrating an example of a data processing system including a solid state drive (SSD) according to an embodiment. Referring to FIG. 8, a data processing system 2000 may include a host apparatus 2100 and an SSD 2200.

The SSD 2200 may include a controller 2210, a buffer memory device 2220, nonvolatile memory devices 2231 to 223n, a power supply 2240, a signal connector 2250, and a power connector 2260.

The controller 2210 may control an overall operation of the SSD 2220.

The buffer memory device 2220 may temporarily store data to be stored in the nonvolatile memory devices 2231 to 223n. The buffer memory device 2220 may temporarily store data read from the nonvolatile memory devices 2231 to 223n. The data temporarily stored in the buffer memory device 2220 may be transmitted to the host apparatus 2100 or the nonvolatile memory devices 2231 to 223n according to control of the controller 2210.

The nonvolatile memory devices 2231 to 223n may be used as a storage medium of the SSD 2200. The nonvolatile memory devices 2231 to 223n may be coupled to the controller 2210 through a plurality of channels CH1 to CHn. One or more nonvolatile memory devices may be coupled to one channel. The nonvolatile memory devices coupled to the one channel may be coupled to the same signal bus and the same data bus.

The power supply 2240 may provide power PWR input through the power connector 2260 to the inside of the SSD 2200. The power supply 2240 may include an auxiliary power supply 2241. The auxiliary power supply 2241 may supply the power so that the SSD 2200 is normally terminated even when sudden power-off occurs. The auxiliary power supply 2241 may include large capacity capacitors capable of charging the power PWR.

The controller 2210 may exchange a signal SGL with the host apparatus 2100 through the signal connector 2250. The signal SGL may include a command, an address, data, and the like. The signal connector 2250 may be configured of various types of connectors according to an interfacing method between the host apparatus 2100 and the SSD 2200.

Figure 9:
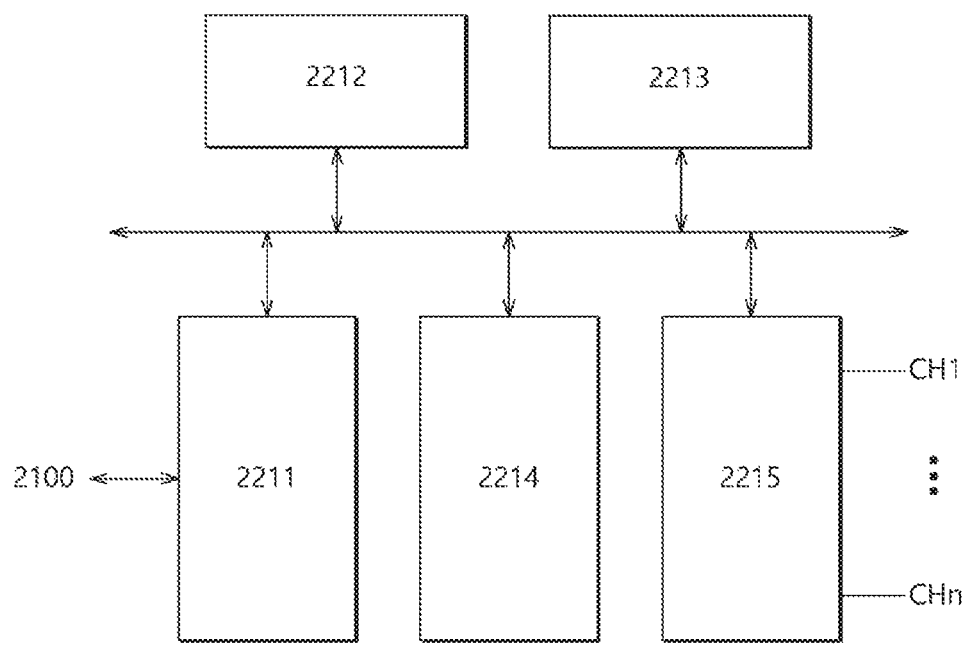
FIG. 9 is a diagram illustrating an example of a controller illustrated in FIG. 8.

FIG. 9 is a diagram illustrating an example of the controller 2210 of FIG. 8. Referring to FIG. 9, the controller 2210 may include a host interface unit 2211, a control unit 2212, a random access memory (RAM) 2213, an error correction code (ECC) unit 2214, and a memory interface unit 2215.

The host interface unit 2211 may perform interfacing between the host apparatus 2100 and the SSD 2200 according to a protocol of the host apparatus 2100. For example, the host interface unit 2211 may communicate with the host apparatus 2100 through any one among a secure digital protocol, a universal serial bus (USB) protocol, a multimedia card (MMC) protocol, an embedded MMC (eMMC) protocol, a personal computer memory card international association (PCMCIA) protocol, a parallel advanced technology attachment (PATA) protocol, a serial advanced technology attachment (SATA) protocol, a small computer system interface (SCSI) protocol, a serial attached SCSI (SAS) protocol, a peripheral component interconnection (PCI) protocol, a PCI Express (PCI-E) protocol, and a universal flash storage (UFS) protocol. The host interface unit 2211 may perform a disc emulation function that the host apparatus 2100 recognizes the SSD 2200 as a general-purpose data storage apparatus, for example, a hard disc drive HDD.

The control unit 2212 may analyze and process the signal SGL input from the host apparatus 2100. The control unit 2212 may control operations of internal functional blocks according to firmware and/or software for driving the SDD 2200. The RAM 2213 may be operated as a working memory for driving the firmware or software.

The ECC unit 2214 may generate parity data for the data to be transferred to the nonvolatile memory devices 2231 to 223n. The generated parity data may be stored in the nonvolatile memory devices 2231 to 223n together with the data. The ECC unit 2214 may detect errors for data read from the nonvolatile memory devices 2231 to 223n based on the parity data. When detected errors are within a correctable range the ECC unit 2214 may correct the detected errors.

The memory interface unit 2215 may provide a control signal such as a command and an address to the nonvolatile memory devices 2231 to 223n according to control of the control unit 2212. The memory interface unit 2215 may exchange data with the nonvolatile memory devices 2231 to 223n according to control of the control unit 2212. For example, the memory interface unit 2215 may provide data stored in the buffer memory device 2220 to the nonvolatile memory devices 2231 to 223n or provide data read from the nonvolatile memory devices 2231 to 223n to the buffer memory device 2220.

Figure 10:
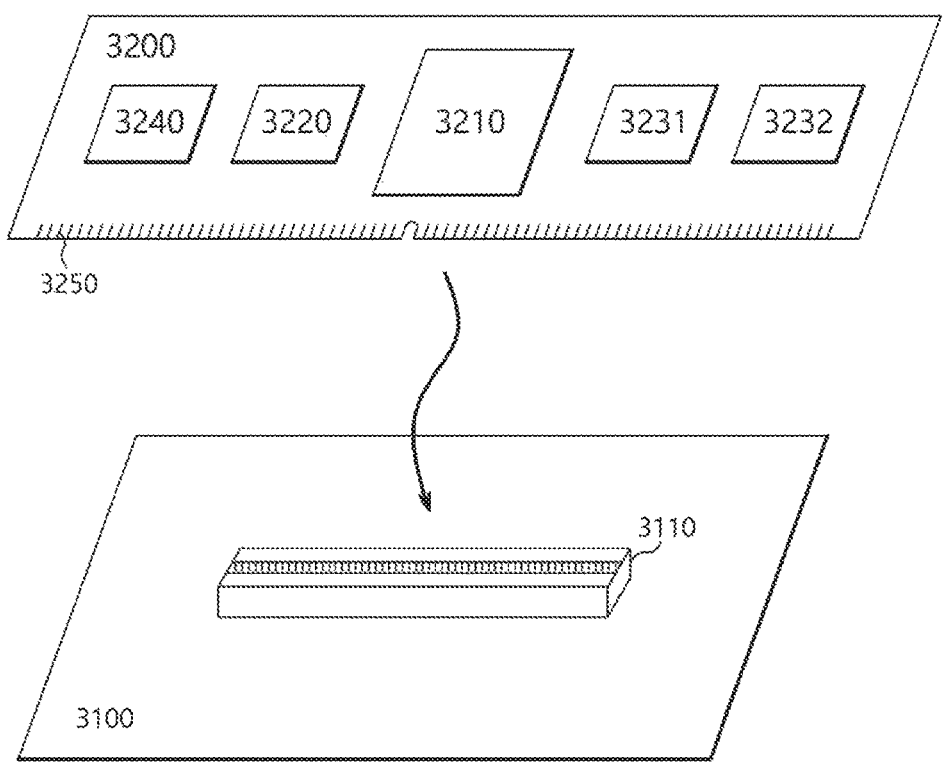
FIG. 10 is a diagram illustrating an example of a data processing system including a data storage apparatus according to an embodiment of the present disclosure.

FIG. 10 is a diagram illustrating an example of a data processing system including a data storage apparatus according to an embodiment. Referring to FIG. 10, a data processing system 3000 may include a host apparatus 3100 and a data storage apparatus 3200.

The host apparatus 3100 may be configured in a board form such as a printed circuit board (PCB). Although not shown in FIG. 10, the host apparatus 3100 may include internal functional blocks configured to perform functions of the host apparatus 3100.

The host apparatus 3100 may include a connection terminal 3110 such as a socket, a slot, or a connector. The data storage apparatus 3200 may be mounted on the connection terminal 3110.

The data storage apparatus 3200 may be configured in a board form such as a PCB. The data storage apparatus 3200 may refer to a memory module or a memory card. The data storage apparatus 3200 may include a controller 3210, a buffer memory device 3220, nonvolatile memory devices 3231 to 3232, a power management integrated circuit (PMIC) 3240, and a connection terminal 3250.

The controller 3210 may control an overall operation of the data storage apparatus 3200. The controller 3210 may have the same configuration as the controller 2210 illustrated in FIG. 9.

The buffer memory device 3220 may temporarily store data to be stored in the nonvolatile memory devices 3231 and 3232. The buffer memory device 3220 may temporarily store data read from the nonvolatile memory devices 3231 and 3232. The data temporarily stored in the buffer memory device 3220 may be transmitted to the host apparatus 3100 or the nonvolatile memory devices 3231 and 3232 according to control of the controller 3210.

The nonvolatile memory devices 3231 and 3232 may be used as a storage medium of the data storage apparatus 3200.

The PMIC 3240 may provide power input through the connection terminal 3250 to the inside of the data storage apparatus 3200. The PMIC 3240 may manage the power of the data storage apparatus 3200 according to control of the controller 3210.

The connection terminal 3250 may be coupled to the connection terminal 3110 of the host apparatus 3100. A signal such as a command, an address, and data and power may be transmitted between the host apparatus 3100 and the data storage apparatus 3200 through the connection terminal 3250. The connection terminal 3250 may be configured in various forms according to an interfacing method between the host apparatus 3100 and the data storage apparatus 3200. The connection terminal 3250 may be arranged in any one side of the data storage apparatus 3200.

Figure 11:
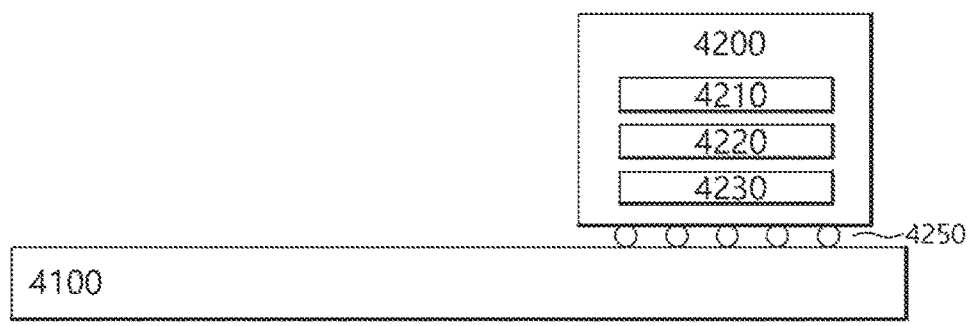
FIG. 11 is a diagram illustrating an example of a data processing system including a data storage apparatus according to an embodiment of the present disclosure.

FIG. 11 is a diagram illustrating an example of a data processing system including a data storage apparatus according to an embodiment. Referring to FIG. 11, a data processing system 4000 may include a host apparatus 4100 and a data storage apparatus 4200.

The host apparatus 4100 may be configured in a board form such as a PCB. Although not shown in FIG. 11, the host apparatus 4100 may include internal functional blocks configured to perform functions of the host apparatus 4100.

The data storage apparatus 4200 may be configured in a surface mounting packaging form. The data storage apparatus 4200 may be mounted on the host apparatus 4100 through a solder ball 4250. The data storage apparatus 4200 may include a controller 4210, a buffer memory device 4220, and a nonvolatile memory device 4230.

The controller 4210 may control an overall operation of the data storage apparatus 4200. The controller 4210 may have the same configuration as the controller 2210 illustrated in FIG. 9.

The buffer memory device 4220 may temporarily store data to be stored in the nonvolatile memory device 4230. The buffer memory device 4220 may temporarily store data read from the nonvolatile memory device 4230. The data temporarily stored in the buffer memory device 4220 may be transmitted to the host apparatus 4100 or the nonvolatile memory device 4230 through control of the controller 4210.

The nonvolatile memory device 4230 may be used as a storage medium of the data storage apparatus 4200.

Figure 12:
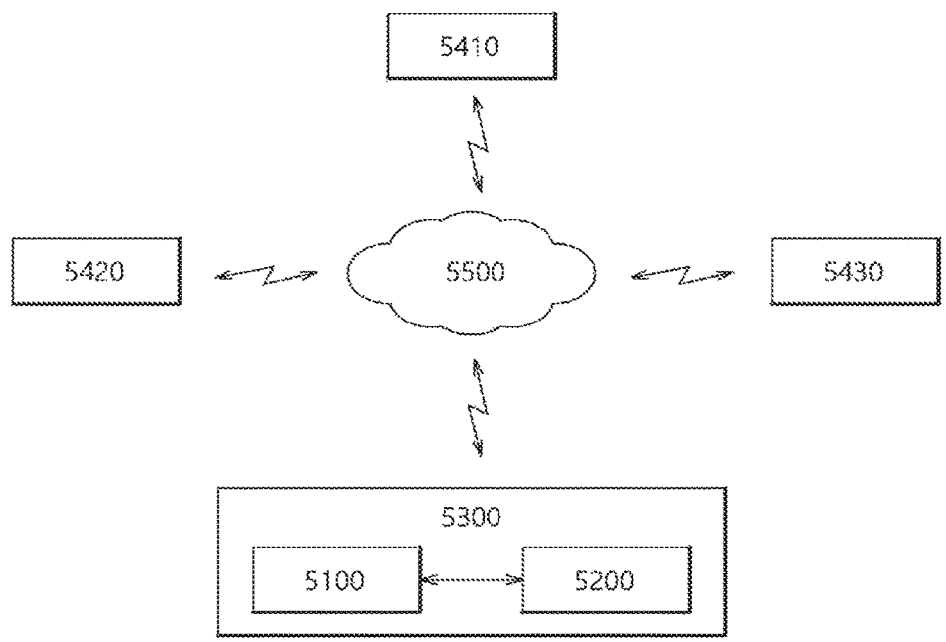
FIG. 12 is a diagram illustrating an example of a network system including a data storage apparatus according to an embodiment of the present disclosure.

FIG. 12 is a diagram illustrating an example of a network system 5000 including a data storage apparatus according to an embodiment. Referring to FIG. 12, the network system 5000 may include a server system 5300 and a plurality of client systems 5410 to 5430 which are coupled through a network 5500.

The server system 5300 may serve data in response to requests of the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host apparatus 5100 and a data storage apparatus 5200. The data storage apparatus 5200 may be configured of the data storage apparatus 10 of FIG. 1, the data storage apparatus 2200 of FIG. 8, the data storage apparatus 3200 of FIG. 10, or the data storage apparatus 4200 of FIG. 11.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:
1. A non-volatile memory device comprising:
a memory cell array including word lines, the word lines including data cells and an over-program flag cell configured to represent whether or not the data cells correspond to an over-programmed cells;

a peripheral circuit configured to store data in the memory cell array or read data from the memory cell array; and a control logic for controlling the peripheral circuit to determine whether or not the data cells are programmable and to program the over-program flag cell corresponding to the data cells under a condition that the data cells are not programmable, when the control logic receives a program command from an external device.

2. The non-volatile memory device of claim 1, wherein each of the word lines in the memory cell array further comprises a normal program flag cell configured to represent whether the data cells are normal program cells, and the control logic determines whether or not the data cells are programmable based on states of the normal program flag cell corresponding to the data cells.

3. The non-volatile memory device of claim 2, wherein the control logic determines the data cells to be non-programmable when the normal program flag cell is in a programmed state, and the control logic determines the data cells to be programmable when the normal program flag cell is in an erased state.

4. The non-volatile memory device of claim 2, wherein the program command received from the external device comprises:
  a single program command for programming the data cells; and
  a complex program command for simultaneously programming the data cells and the normal program flag cell corresponding to the data cells.

5. The non-volatile memory device of claim 4, wherein the control logic controls the peripheral circuit to program the data cells when the control logic receives the single program command, and the control logic controls the peripheral circuit to simultaneously program the data cells and the normal program flag cell corresponding to the data cells when the control logic receives the complex program command.

6. The non-volatile memory device of claim 2, wherein the control logic provides the external device with state information of the data cells of a target word line based on states of the normal program flag cell and the over-program flag cell of the target word line when the control logic receives a command for identifying states of the target word line from the external device.

7. The non-volatile memory device of claim 6, wherein the control logic provides the external device with the state information in which the data cells of the target word line are normally programmed data cells when the normal program flag cell is in a programmed state and the over-program flag cells is an erased state and the control logic provides the external device with the state information in which the data cells of the word line are over-programmed data cells when the normal program flag cell and the over-program flag cell are the programmed state.

8. A method for operating a non-volatile memory device, the method comprising:
  determining whether or not data cells are programmable when a program command is received from an external device; and
  programming an over-program flag cell corresponding to the data cells when the data cells are not programmable.

9. The method of claim 8, wherein determining whether or not the data cells are programmable comprises:
  identifying whether a normal program flag cell corresponding to the data cells is in a programmed state or an erased state;

determining the data cells to be non-programmable when the normal program flag cell is the programmed state; and determining the data cells to be programmable when the normal program flag cell is the erased state.

10. The method of claim 9, wherein the program command comprises a single program command for programming the data cells, and a complex program command for simultaneously programming the data cells and the normal program flag cell corresponding to the data cells.

11. The method of claim 9, wherein the normal program flag cell represents normally programmed data cells when the data cells are in the erased state, and the over-program flag cell represents abnormally programmed cells when the data cells are in the programmed state.

12. The method of claim 11,
  wherein one word line includes the data cells, the normal program flag cell corresponding to the data cells and the over-program flag cell corresponding to the data cells,
  further comprising:
  identifying states of the normal program flag cell and the over-program flag cell in a page when a command for identifying states of the word line is received; and
  providing the external device with state information of the data cells in the word line based on the states of the normal program flag cell and the over-program flag cell.

13. The method of claim 12, wherein providing the state information of the data cells to the external device comprises:
  providing the external device with information indicating that the data cells of the word line are normally programmed data cells when the normal program flag cell is in the programmed state and the over-program flag cell is in the erased state; and
  providing the external device with information indicating that the data cells of the word line are over-programmed data cells when the normal program flag cell and the over-program flag cell are the programmed state.

14. A data storage device comprising:
  a non-volatile memory device; and
  a controller configured to the non-volatile memory device,
  wherein the non-volatile memory device comprises:
  a memory cell array including word lines, the word lines including data cells and an over-program flag cell configured to represent whether or not the data cells correspond to an over-programmed cells;
  a peripheral circuit configured to store data in the memory cell array or read data from the memory cell array; and
  a control logic for controlling the peripheral circuit to determine whether or not the data cells are programmable and to program the over-program flag cell corresponding to the data cells under a condition that the data cells are not programmable, when the control logic receives a program command from the controller.

15. The data storage device of claim 14, wherein the memory cell array further comprises a normal program flag cell configured to represent whether the data cells are normal program cells, and the control logic determines whether or not the data cells are programmable based on states of the normal program flag cell corresponding to the data cells.

16. The data storage device of claim 15, wherein the program command comprises:
   a single program command for programming the data cells; and
   a complex program command for simultaneously programming the data cells and the normal program flag cell corresponding to the data cells.

17. The data storage device of claim 16, wherein the control logic controls the peripheral circuit to program the data cells when the control logic receives the single program command, and the control logic controls the peripheral circuit to simultaneously program the data cells and the normal program flag cell corresponding to the data cells when the control logic receives the complex program command.

18. The data storage device of claim 15, wherein the controller transmits a command for identifying states of the word line to the non-volatile memory device, and the control logic identifies states of the normal program flag cell and the over-program flag cell in response to the command with respect to the word line, and the control logic provides the controller with the state information of the data cells of the word line based on the states of the normal program flag cell and the over-program flag cell.

19. The data storage device of claim 18, wherein the control logic provides the external device with the state information indicating that the data cells of the word line are normally programmed data cells when the normal program flag cell is a programmed state and the over-program flag cells is an erased state, and the control logic provides the external device with the state information indicating that the data cells of the word line are over-programmed data cells when the normal program flag cell and the over-program flag cell are the programmed state.

* * * * *